(12) United States Patent
Tesdahl et al.

(10) Patent No.: US 6,930,494 B2
(45) Date of Patent: Aug. 16, 2005

(54) CAPACITIVE PROBE ASSEMBLY WITH FLEX CIRCUIT

(75) Inventors: Curtis A. Tesdahl, Fort Collins, CO (US); David T. Crook, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/652,232

(22) Filed: Aug. 29, 2003

(65) Prior Publication Data

US 2005/0046428 A1 Mar. 3, 2005

(51) Int. Cl.[7] .............................................. G01R 27/26
(52) U.S. Cl. ...................................... 324/690; 324/686
(58) Field of Search ................................ 324/658, 660, 324/686, 688, 690, 158.1

(56) References Cited

U.S. PATENT DOCUMENTS

| | | | |
|---|---|---|---|
| 5,254,953 A | 10/1993 | Crook et al. | 324/538 |
| 5,274,336 A | 12/1993 | Crook et al. | 324/690 |
| 5,373,231 A * | 12/1994 | Boll et al. | 324/158.1 |
| 5,381,417 A | 1/1995 | Loopik et al. | 714/724 |
| 5,498,964 A | 3/1996 | Kerschner et al. | 324/536 |
| 5,557,209 A * | 9/1996 | Crook et al. | 324/537 |
| 5,646,538 A * | 7/1997 | Lide et al. | 324/662 |
| 5,696,451 A | 12/1997 | Keirn et al. | 324/687 |

* cited by examiner

Primary Examiner—Vincent Q. Nguyen

(57) ABSTRACT

A novel capacitive sensor assembly that utilizes a flex circuit for amplification of capacitively sensed signals and for separating the power, ground, and measurement signals is presented. The use of a flex circuit in the capacitive probe assembly allows implementation of multiple capacitive sensors for respectively capacitively coupling multiple signals from respective multiple test points of a circuit under test. The invention integrates the sensor plate, amplifier, and return wiring for each capacitive sensor all onto one flex circuit.

10 Claims, 12 Drawing Sheets

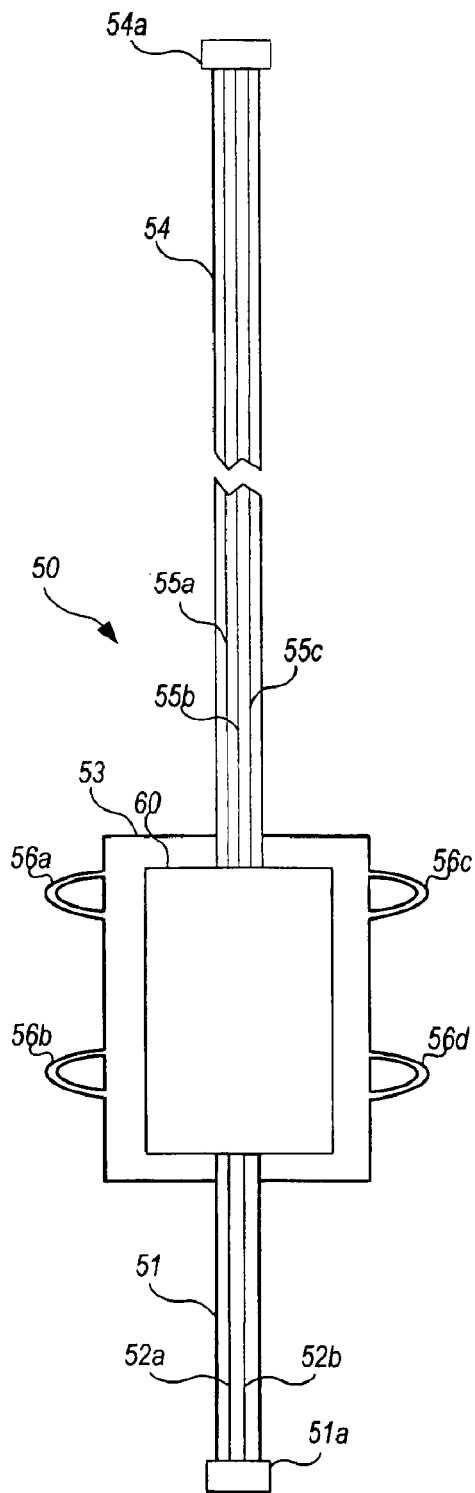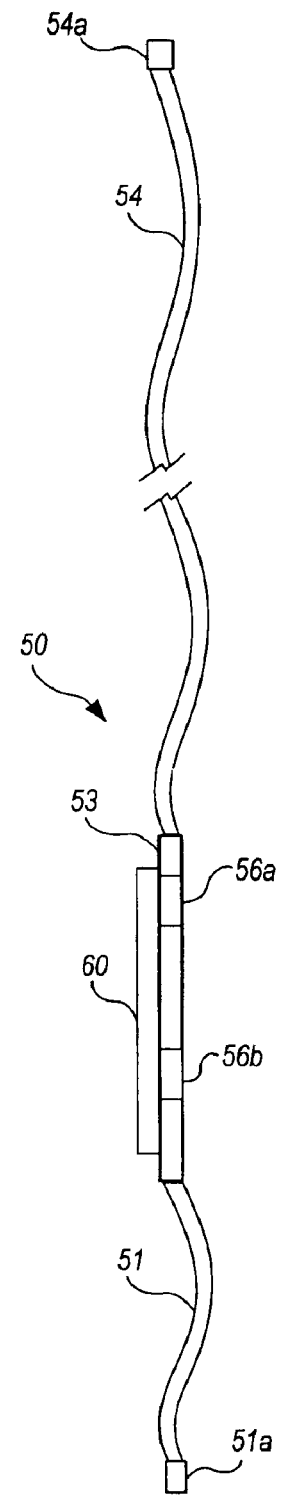
FIG. 9                    FIG. 10

CAPACITIVE PROBE ASSEMBLY WITH FLEX CIRCUIT

BACKGROUND OF THE INVENTION

The present invention pertains generally to electrical circuit testing and more particularly to a capacitive probe assembly with flex circuit for use in printed circuit board testing.

Capacitive coupling sensors are used in the testing of electrical circuits for the identification of open-circuit faults. These sensors are regularly used to determine whether the leads of semiconductor components are present and properly soldered or otherwise connected to a printed circuit board. Typical implementation of capacitive probe assemblies that implement a capacitive sensor may be found in the following references, each of which is incorporated herein by reference for all that it teaches: U.S. Pat. No. 5,498,964, to Kerschner et al., entitled "Capacitive Electrode System for Detecting Open Solder Joints in Printed Circuit Assemblies", U.S. Pat. No. 5,124,660 to Crook et al., entitled "Identification of Pin-Open Faults By Capacitive Coupling Through the Integrated Circuit Package", U.S. Pat. No. 5,254,953 to Crook et al., entitled "Identification of Pin-Open Faults By Capacitive Coupling Through the Integrated Circuit Package", and U.S. Pat. No. 5,557,209 to Crook et al., entitled "Identification of Pin-Open Faults By Capacitive Coupling Through the Integrated Circuit Package".

FIG. 1 shows a portion of a prior art printed circuit board open-fault test circuit 300 which illustrates the typical use and operation of a capacitive sensor. As shown in FIG. 1, the open-fault test circuit 300 includes a signal source 330, which supplies a signal, typically eight kiloHertz (8 KHz) at two hundred millivolts (120 mV). The output of signal source 330 is connected to a printed circuit board trace 332, which is connected to the integrated circuit lead under test 12 at 334. The connection of the signal source 330 to the trace 332 is typically made through a bed of nails connection pin. To reduce the effects of stray capacitive coupling between leads which interferes with the measurement of the lead under test, all leads not being currently tested are preferably grounded.

A capacitive test probe 320 is placed on top of the integrated circuit package 10. A thin dielectric (not shown) may be placed between the component package 10 and the test probe 320. The capacitive test probe 320 is connected to a measuring device 335, such as an ammeter, a voltmeter or computing means to compute the effective capacitance. When the measurement falls outside predetermined limits a determination is made that the lead being tested is diagnosed as being open.

When the test is performed, the signal source 330 is activated and applied to trace 332 on the printed circuit board which should be attached to the lead being tested 12 at location 334. The source signal should then pass to the lead 12 of the component 10. Through capacitive coupling, the signal is passed to the capacitive test probe 320 and then to the measuring device 335. If the measured parameter falls within predetermined limits, then the lead 12 is connected to the trace 332 at location 334. If the lead 12 is not connected at location 334 or if the wire trace 332 is broken, a smaller signed will be conducted to the capacitive test probe 320 and the threshold level of the signal will not be measured by the measuring device 335, indicating that an open fault is present.

FIG. 2 shows a top, front perspective view, and FIG. 3 shows a side cut-away view, of a prior art test probe, namely a TestJet® probe, manufactured by Agilent Technologies of Palo Alto, Calif., the assignee of interest of the present invention. Referring now to FIGS. 2 and 3, the capacitive test probe 320 includes a capacitive plate 323, a guard plate 324, an active buffer circuit 326, a signal electrode spring pin 321a and a guard electrode spring pin 321b. The capacitive plate 323 and the guard plate 324 are separated by a dielectric 325. During test, the capacitive plate 323 forms a capacitor with a conductive plate of the component (e.g., one of integrated circuit leads 313a–313h in FIG. 4) under test. The capacitive plate 323 of the test probe 320 is electrically coupled to an active buffer circuit 326, which is located on the top surface of the dielectric and surrounded by the guard plate 324. The capacitive plate 323 is connected to the buffer circuit 326 at a location 327 (see FIG. 3). The amplification of the signal by the buffer circuit 326 which is in close proximity to the capacitive plate 323 where the signal is received helps to significantly optimize the signal to noise ratio, thereby decreasing the effect of system noise and stray capacitance.

A groove 328 is etched all the way around the area of the buffer circuit 326 to electrically isolate the buffer circuit 326 from the guard plate 324. The buffer circuit 326 is electrically connected by a pin in socket connector 322b to a standard signal electrode spring pin 121a, which acts as an electrical coupling means to a measuring device. The guard plate 324 is electrically connected by a pin in socket connector 322b to a guard electrode spring pin 121b, which electrically couples the guard plate to system ground or a controlled voltage source.

FIG. 4 shows a top cut away view of the integrated circuit component 10 and the capacitive test probe 320. FIGS. 1 and 4 illustrate how the capacitive coupling occurs between the capacitive test probe 320 and the leads 12 of the integrated circuit. Referring now to FIGS. 1 and 4, the integrated circuit package 10 contains an integrated circuit die 11. The integrated circuit die 11 contains connections, however, these connections must be made to the outside of the integrated circuit package 10. Therefore, the lead 12 is connected to an internal conductor 13 that connects the lead 12 to a location just adjacent to the integrated circuit 11. There a small wire (bond wire) spans between the conductor 13 and a location on the integrated circuit 11. Similar connections are made to all the other leads of the integrated circuit package 10.

The conductor 13 forms an electrically conductive plate, which acts as one plate of a capacitor. The other plate of the capacitor is formed by a capacitive plate 323 of the capacitive test probe 320 (see FIG. 1). Although the capacitor created in this manner is small, it is sufficient to conduct a signal between the lead 12 and the capacitive test probe 320 when the test probe 320 is aligned over the top of the integrated circuit package 10, as shown in FIGS. 1 and 4.

It would be desirable to have a method and apparatus for obtaining multiple capacitively coupled signal measurements simultaneously. Although the size of a capacitive probe assembly may be made to be quite small, it cannot compete with the spacing of integrated circuit package test leads. Accordingly, in order to test all integrated circuit package test leads yet reduce or eliminate complicated robotic circuitry for positioning the probe over a given pin, it would also be desirable to be able to place multiple capacitive sensing probes on one capacitive probe assembly.

SUMMARY OF THE INVENTION

The present invention is a novel capacitive sensor assembly that utilizes a flex circuit for amplification of capacitively sensed signals and for separating the power, ground, and measurement signals. The use of a flex circuit in the capacitive probe assembly allows implementation of multiple capacitive sensors for respectively capacitively coupling multiple signals from respective multiple nodes of a circuit under test. The invention integrates the sensor plate, amplifier, and return wiring for each capacitive sensor all onto one flex circuit.

In the preferred embodiment, the capacitive sensor assembly comprises a segmented probe that includes a plurality of individual probe plates and a flex circuit that includes a separate amplification circuit for each of the plurality of individual probe plates. Separate signal traces pass signals between the segmented probe plates on the probe plate assembly is and the amplifier circuits on the flex circuit.

This invention is advantageous over the prior art for several reasons. First, the use of a flex circuit allows multiple signal wires between the capacitive probe assembly and testing circuit allows the ability to provide multiple capacitive sensors on a single capacitive probe assembly, which in turn reduces the complexity of the tester control circuitry (e.g., robotics), reduces the number of probe assemblies required to test a given circuit under test, and reduces in-circuit test time (since fewer capacitive sensors need be shared).

In addition, since the number of connecting wires between the capacitive probe assembly and testing circuit are not limited to only a single pair as in the prior art, the use of a flex circuit allows the ability to separate the power and signal channels of each capacitive sensor on the assembly. This allows higher-precision measurements and less-sensitive communication circuitry.

Furthermore, the use of a flex circuit allows the ability to collect measurements from each of the capacitive sensors in parallel, which significantly reduces test time.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 9 is a top view of a flex circuit of a capacitive probe assembly implemented in accordance with the invention;

FIG. 10 is a side view, of the flex circuit of FIG. 9;

DETAILED DESCRIPTION OF THE INVENTION

Figure 1:
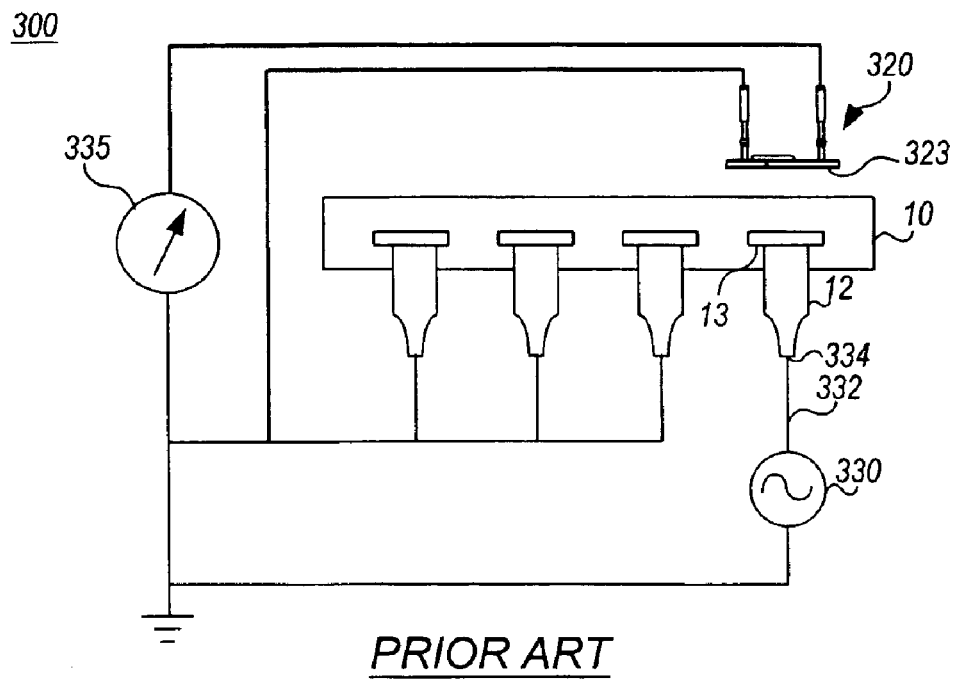
FIG. 1 is a schematic block diagram of a prior art open-fault circuit test system which illustrates the typical use and operation of a prior art capacitive probe assembly.
Figure 5:
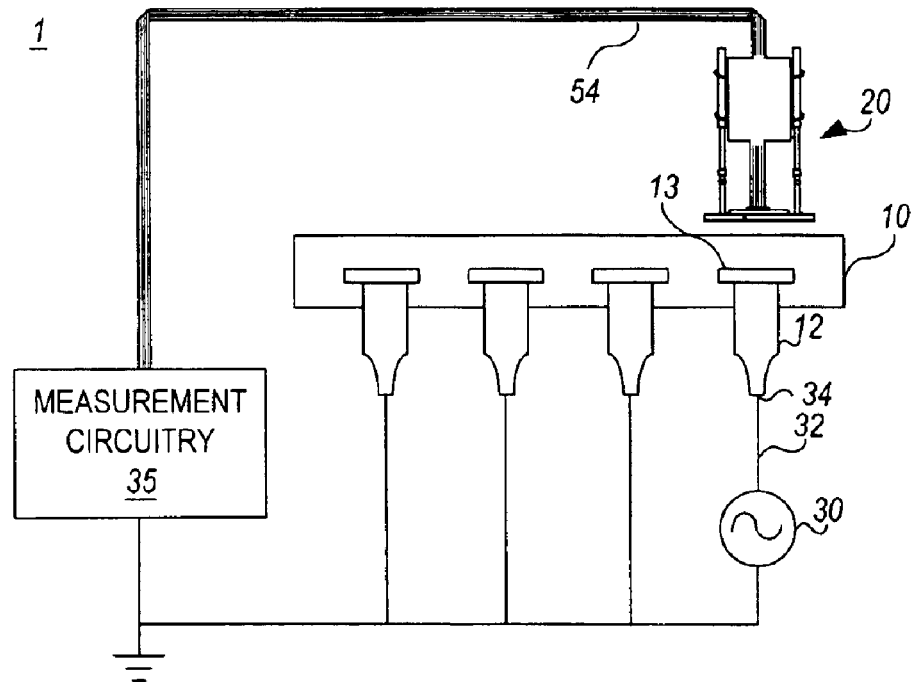
FIG. 5 is a schematic block diagram of an open-fault circuit test system which utilizes a capacitive probe assembly implemented in accordance with the invention.
Figure 2:
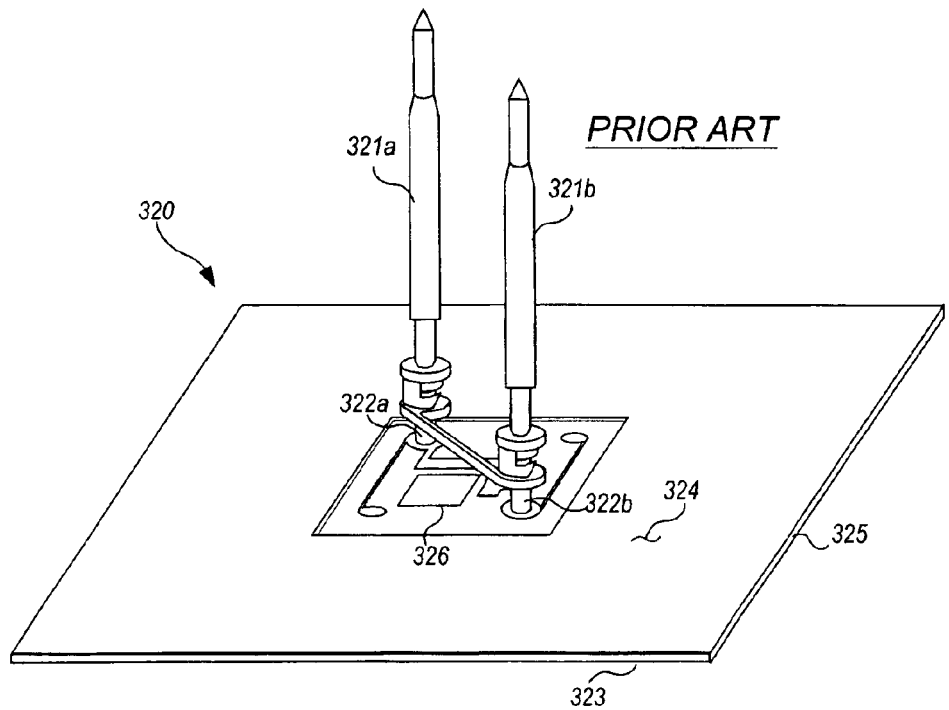
FIG. 2 is a top, front perspective view of a prior art capacitive probe assembly.
Figure 3:
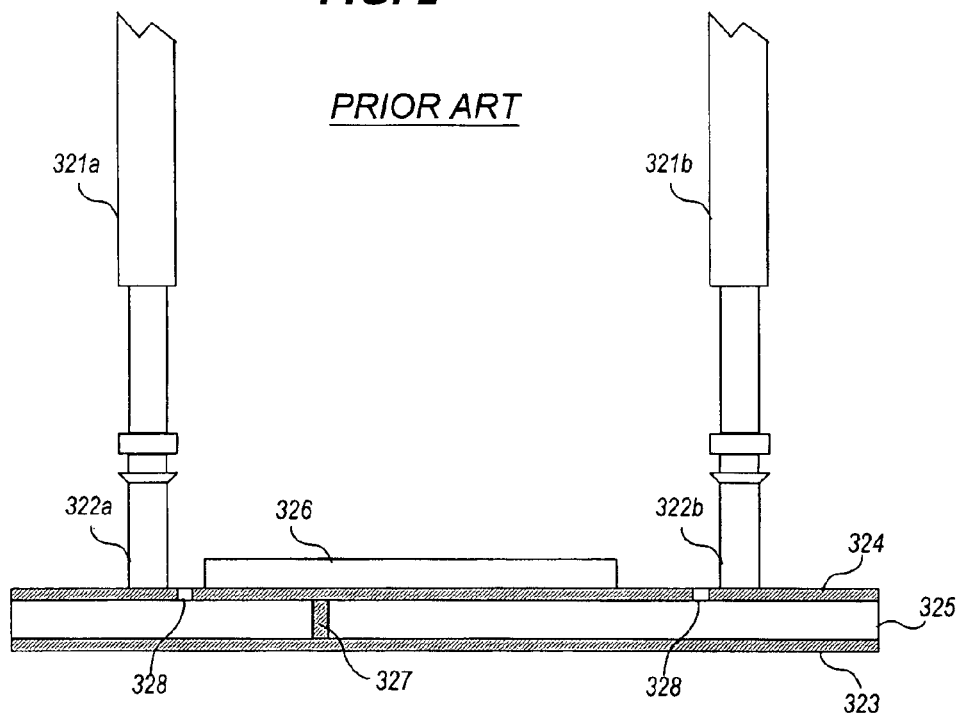
FIG. 3 is a side cut away view of the prior art capacitive probe assembly of FIG. 2.
Figure 4:
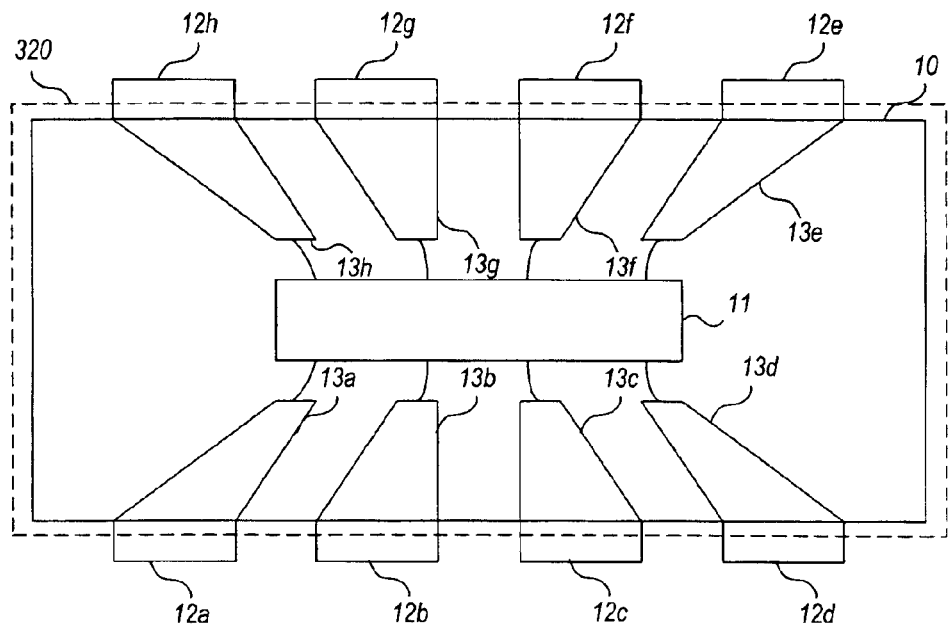
FIG. 4 is a top cut-away view of an integrated circuit.

Turning now to the invention, FIG. 5 illustrates a first embodiment of an open-fault circuit test system 1 which utilizes a capacitive probe assembly 20 implemented in accordance with the invention. As shown, the open-fault circuit system 1 includes a signal source 30 with an output connected to a printed circuit board trace 32 that is designed to connect to integrated circuit lead 12 under test at 34.

A capacitive probe assembly 20 implemented in accordance with the invention is placed on top of the integrated circuit package 10. A thin dielectric (not shown) may be placed between the component package 10 and the test probe 20. The capacitive probe assembly 20 is connected to measurement circuitry 35 which may include an ammeter, a voltmeter or computing means to compute the effective capacitance. When a given measurement falls outside predetermined limits, the connection between the lead 12 under test and the trace 32 is diagnosed as being open.

When the test is performed, the signal source 30 is activated and applied to trace 32 on the printed circuit board which should be attached to the lead 12 being tested at location 34. The signal should then pass to the lead 12 of the integrated circuit package 10. Through capacitive coupling, the signal is passed to the capacitive test probe 20 and then to the measurement circuitry 35. If the measured parameter falls within predetermined limits, then the lead 12 is connected to the trace 32 at location 34. If the lead 12 is not connected at location 34 or if the wire trace 32 is broken, a smaller signed will be conducted to the capacitive test probe 20 and the threshold level of the signal will not be measured by the measurement circuitry 35, indicating that an open fault is present.

As the signals being measured are extremely small, the effects of noise, system capacitance and cross-talk must be minimized as much as possible. One technique to reduce undesired capacitance when testing an integrated circuit, is to guard all ground, power and other device leads not directly involved in the measurement of the integrated circuit. The grounding of unused leads is called "guarding" which is presently considered the best mode to reduce noise. This guarding prevents cross-talk between the lead being tested and other leads on the integrated circuit component, thus, reducing any stray capacitive coupling between leads and providing a better indication of when a lead is not connected.

In place of the buffer circuit and shielding, a learning technique which uses a learned value measurement may be used. With the learning technique a known good board is measured with the measuring device and the capacitance value for each pin is stored. The capacitance for each pin of every unknown board is measured and compared to the learned capacitance for each pin. If the capacitance change for any pin is more than a predetermined amount, then the unknown boards solder joint is defective. As an example experimental data has shown that the capacitance between the component lead and the test probe is approximately 40 femto farads of capacitance for a 0.65 mm pitch quad flat pack. If the capacitance change for a pin is more than 30 femto farads, then the solder joint is open. This value could be increased or decreased by the user to improve the diagnostic accuracy of the test. An exemplary embodiment of such a learning technique is described in detail in U.S. Pat. No. 6,324,486, entitled "Method And Apparatus For Adaptively Learning Test Error Sources To Reduce The Total Number Of Test Measurements Required In Real-Time", to Crook et al., and is herein incorporated by reference for all that it teaches.

Figure 6:
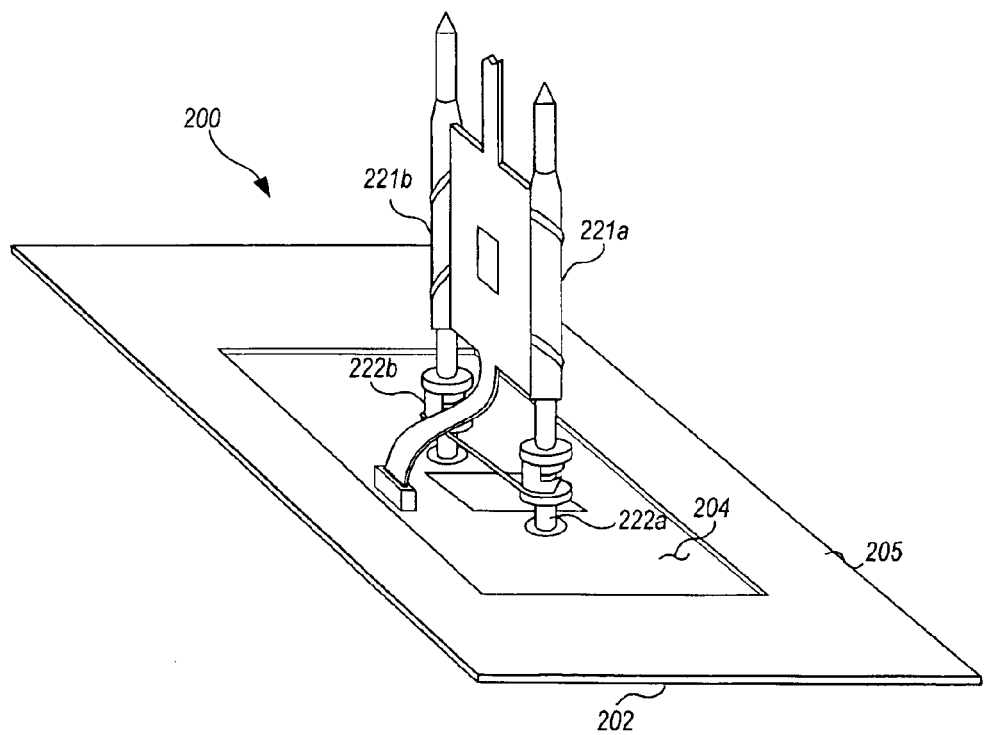
FIG. 6 is a top, front perspective view of a first embodiment of a capacitive probe assembly implemented in accordance with the invention.
Figure 7:
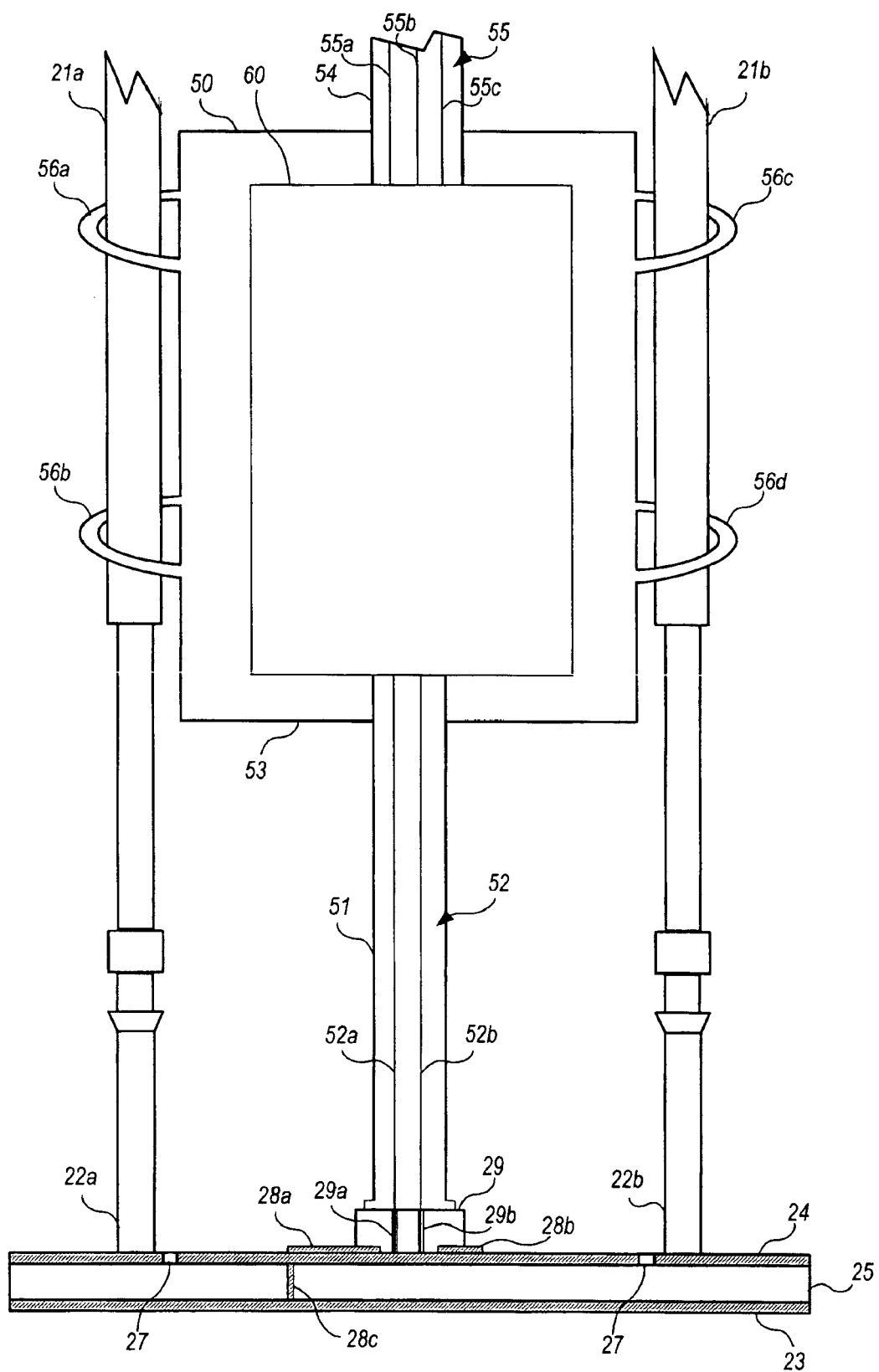
FIG. 7 is a front cut-away view of the capacitive probe assembly of FIG. 6.
Figure 8:
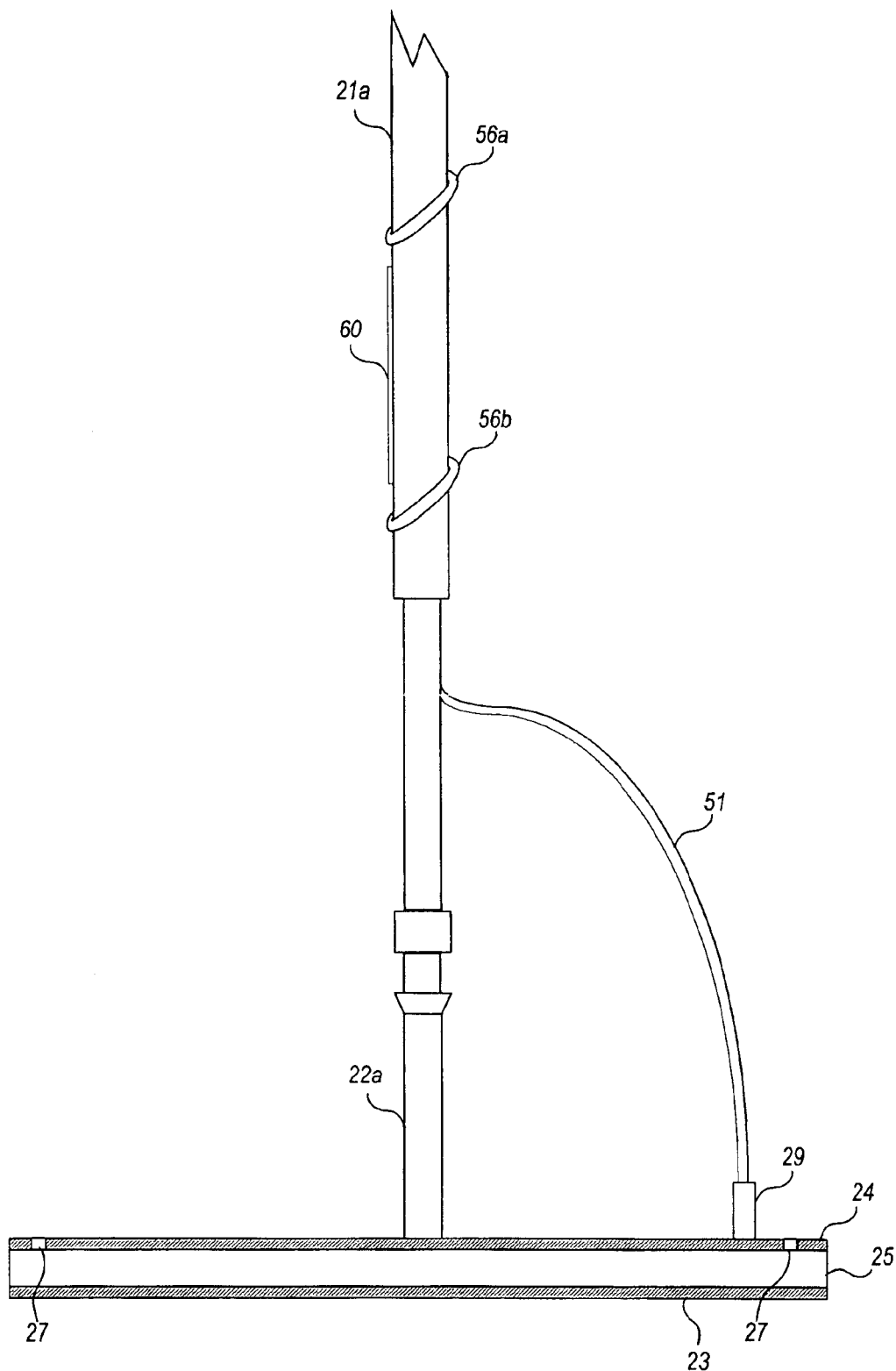
FIG. 8 is a side cut-away view of the capacitive probe assembly of FIGS. 6 and 7.

FIG. 6 shows a top, front perspective view of a first embodiment of the test probe 20, FIG. 7 shows a front cut-away view of the test probe 20, and FIG. 8 shows a side cut-away view of the test probe. Referring now to FIGS. 6, 7 and 8, the capacitive test probe 20 includes a capacitive plate 23, a guard plate 24, a flex circuit connector 29, a first support pin 21a and a second support pin 21b. The capacitive plate 23 and the guard plate 24 in the present invention are made of copper, but can be made of any electrically conductive material. The capacitive plate 23 and the guard plate 24 are separated by a dielectric 25, such as glass filled plastic or any other insulative material. The dielectric is approximately 0.04 inches thick. It should be understood that if the dielectric 25 is too thin, the capacitive reading will be distorted upward, and if the dielectric is too thick, the shielding effect of the guard plate will be reduced and stray system capacitance will be detected. The capacitive plate 23 in the present invention forms a capacitor with the conductive plate 13 in the integrated circuit (see FIG. 5).

The capacitive plate 23 of the test probe 20 is electrically coupled to a socket 29a in flex circuit connector 29, which is mounted on the top surface of the dielectric 25 and surrounded by the guard plate 24. The capacitive plate 23 is connected to the socket 29a of the flex circuit connector 29 at connection 28a and 28c (see FIG. 7). Connection 28a and 28c preferably comprise a via 28c connecting capacitor plate 23 to a conductive trace 28a printed on the surface of dielectric 25 and surrounded by guard plate 24. The conductive trace 28a connects to connector socket 29a.

The guard plate 24 is connected to the socket 29b of the flex circuit connector 29 at connection 28b (see FIG. 7). Connection 28b preferably comprises a trace 28b connecting guard plate 24 to a conductive trace 28b printed on the surface of dielectric 25 and surrounded by guard plate 24. The conductive trace 28b connects to connector socket 29b.

During manufacturing, the dielectric 25 is deposited on the capacitive plate 23 and then the guard plate 24 is deposited on the dielectric. Next, the guard plate is etched down to the dielectric 25 to form respective traces 28a and 28b between the respective signal via 28c and guard plate pad and to respective signal and ground pads. The flex circuit connector 29 is mounted on the top surface of the dielectric 25, connecting flex circuit connector signal socket 29a and flex circuit connector ground socket 29b to the respective signal and ground traces 28a and 28b. A groove 27 is etched around the signal trace 28a to electrically isolate it from the guard plate 24. Support pins 21a and 21b are mounted on the top surface of the dielectric 25. Support pins 21a and 21b operate both as support for the flex circuit 50 and plate assembly 23, 24, 25, discussed hereinafter, and also as the means by which the entire capacitive probe assembly 20 is supported and optionally positioned by a robotic mechanism (not shown) by the test system 1.

Support pins 21a and 21b are preferably spring pins. For example, support pins 21a and 21b can be standard off-the-shelf spring pins, such as a 100PR4070 made by QA Technology Company of Hampton, N.H. Spring pins 21a and 21b give the test probe z-axis travel, which allows for intimate coupling with the integrated circuit component 10 to be tested, regardless of the height of the component. Also, when the invention is used to test an entire circuit board, the z-axis travel of the spring pins permit all of the capacitive probe assemblies 20 to intimately contact the corresponding circuit components under test, even if the heights of the components are not uniform. This z-axis travel can be accomplished by other means such as hydraulic pins with z-axis travel. Moreover, the z-axis travel is not necessary, as long as the capacitive probe assembly 20 is positioned a predetermined distance from the integrated circuit package so that the capacitance measurement can be properly obtained. Therefore, the capacitive probe assembly 20 can alternatively be mounted directly into a test fixture without spring pins or with spacers.

The spring pins 21a and 21b are attached to standard connectors 22a and 22b via pin in socket coupling. Connectors 22a and 22b can be standard off-the-shelf connectors such as Amp Connector 2-331272-7 by AMP Incorporated, Harrisburg, Pa. 17105-11126. The connectors 22a and 22b are soldered to the signal pad 28a and to the guard pad 28b, respectively. The pin in socket coupling between the spring pins and the connectors is flexible enough to create a slight x,y plane swivel, which allows the capacitive probe assembly 20 to conform to the top surface of the integrated circuit to be tested if the bottom surface of the capacitive probe assembly 20 is angularly offset from the top surface of the integrated circuit component, thus allowing a substantially uniform distance to be maintained between the capacitive probe assembly 20 and the integrated circuit component 10. A clip (not shown) can be used to lock the spring pins into the connector sockets 22a and 22b, which still allows a slight x,y plane swivel, while securing the spring pins to the connectors. This x,y plane and z axis flexibility can also be accomplished by using a flexible mylar film or a conductive foam rubber in place of capacitive plate 23. Also, the conductive plate 23 can be a deformable conductive material so that it can conform to match the surface of the element under test. The term component under test is intended to mean active component, passive component, electrical connectors such as pin connectors, sockets or other devices that have a solder connection between the printed circuit board trace and the device.

FIG. 9 is a top view (wherein the top of the flex circuit is arbitrarily chosen as the surface on which a surface mount amplifier circuit 60a may be mounted), and FIG. 10 is a side view, of an exemplary embodiment of flex circuit 60 when the flex circuit 60 is stretched out flat. As shown therein, the flex circuit 50 includes an active buffer circuit 60, a flex host cable 54, and a flex sensor cable 51. The flex host cable 54 includes traces 55a, 55b, 55c that are routed between a host connector probe 54a and the active buffer circuit 60a. The flex host cable 54 preferably includes separate traces 55a, 55c for each of the power signal and ground signal, which are provided by the host when the flex circuit 50 is connected to the host by seating the host connector probe 54a in a mating host connector socket (not shown). The flex host cable 54 preferably includes a separate trace 55b for the capacitively coupled measurement signal that is returned by the capacitive probe assembly to the host.

The flex sensor cable 51 includes traces 52 that are routed between active buffer circuit 60 and the probe plate assembly 23, 24,25. The flex sensor cable 51 preferably includes separate traces 52a, 52b, including at least one trace 52a for the capacitively coupled signal, which is capacitively coupled through capacitive plate 23, and at least one trace 52b for the guard signal, which is provided by the host circuit ground signal 55c. The flex sensor cable 51 traces terminate at a probe plate assembly probe 51a, which is seatable in a mating probe plate assembly connector socket 29.

The traces 52 and 55 on the flex sensor cable 51 and on the flex host cable 54 are preferably coated with an insulating material such as a polymide cover to shield the traces from unwanted noise and stray capacitance. The amplification of the capacitive coupled signal by the active buffer circuit 60 which is in close proximity to the capacitive plate 23 where the signal is received helps to significantly optimize the signal to noise ratio, thereby also decreasing the effect of system noise and stray capacitance.

Referring to FIGS. 6–10, the flex circuit 50 includes support pin attachment means, such as support attachment loops 56a–56d as shown, which are formed integral to the flex circuit 50, and which are looped around the support pins 21a and 21b during assembly of the capacitive probe assembly 20 to assist in supporting the flex circuit 50 in proper position on the assembly 20 to align the flex sensor connector probe 51a with the connector 29 on the probe plate assembly 23, 24, 25. The support pin attachment means may alternatively comprise metal or plastic loops, clips, epoxy, and/or any other appropriate attachment devices or methods.

Figure 11:
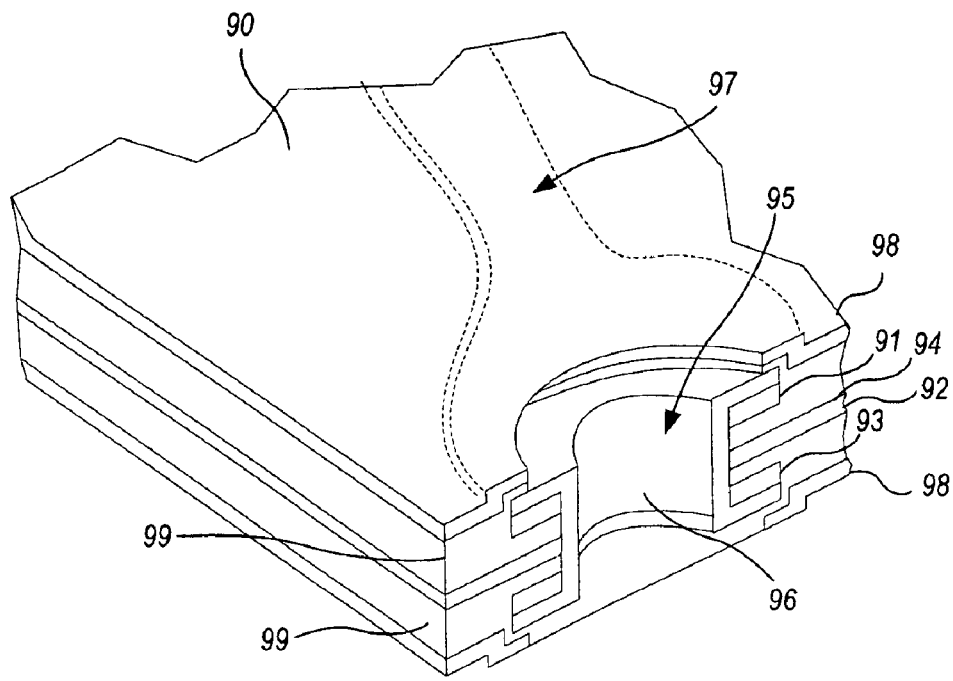
FIG. 11 is a perspective cut-away view of a portion of a flex circuit illustrating various fabrication layers.

To create the flex circuit 50, a portion of which is shown in FIG. 11, a first conductive layer 91 (e.g., copper) is laminated, printed, or adhesively 99 or otherwise attached to a first side of an insulative flexible layer 92 (e.g., polyimide substrate). If the flex circuit 50 will have multiple layers, a second conductive layer 93 is likewise attached to a second side opposite the first side of the insulative flexible layer, and the resulting flex assembly is drilled where vias 95 are to connect the first conductive layer 91 to the second conductive layer 93. The drilled holes are then conductively plated 96. The conductive layer(s) of the flex assembly are then etched to create conductors 97 and pads. The process is repeated to create additional layers if necessary. Stiffener layers 94 made of material such as polyimide glass may optionally be sandwiched between conductive layers 91 and 93 to obtain the desired stiffness of the flex circuit 50. To shield the circuitry, a polyimide cover is laminated over any exposed etched conductive layer(s).

Figure 12:
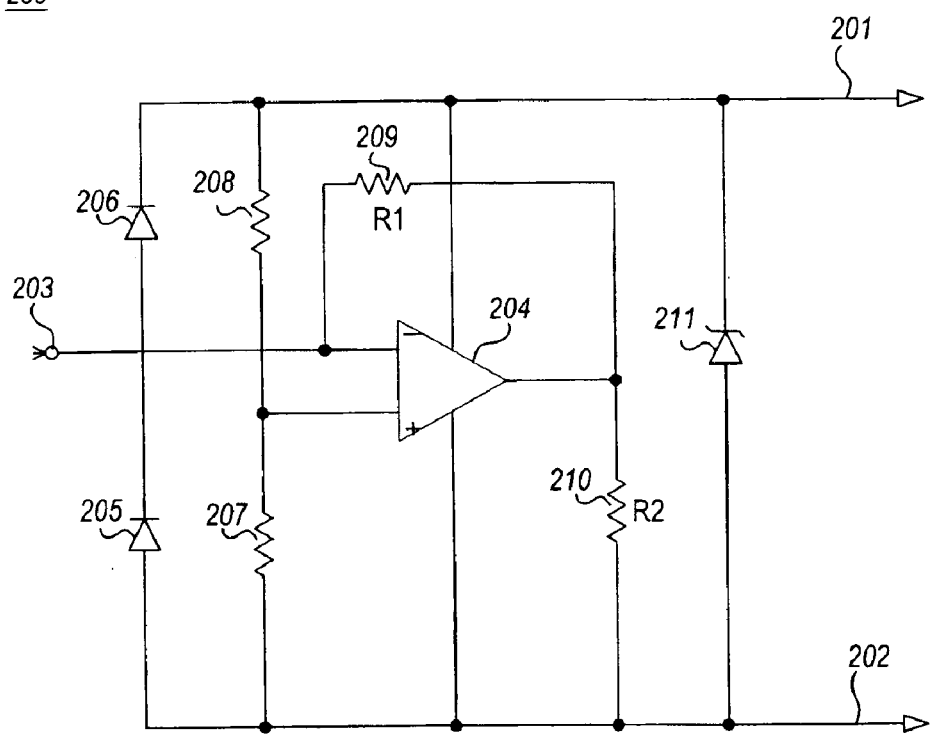
FIG. 12 is a schematic of an exemplary embodiment of an active buffer circuit that may be implemented on the flex circuit of the invention.

FIG. 12 is a schematic of an exemplary embodiment 200 of the active buffer circuit 60a used in accordance with the present invention. Referring now to FIG. 12, the buffer circuit 200 is a standard amplifier circuit used to amplify the signal received from the capacitive plate 23, thus increasing the signal to noise ratio and decreasing the effects of stray capacitance. There can be many alternative circuits to accomplish this amplifying effect as would be readily apparent by an artisan in the field. The amplifier 200 includes a standard operational amplifier 204, standard silicon small signal diodes 205 and 206, and a standard 7.5 V zener diode 211. Resistors 207 and 208 are 100 K ohm resistors and resistors 209 and 210 are 1 M ohm and 464 ohm resistors, respectively. The circuit input 203 is electrically coupled to the trace connected to signal probe 29a to receive the capacitvely coupled signal from the capacitive plate 23. The circuit output 201 is electrically coupled to the measurement signal trace returning to the host and the circuit ground 202 is electrically coupled to system ground or guard signal provided by the host. The active buffer circuit 200 is utilized in the present invention to reduce the effects of stray capacitance by amplifying the signal, thus making stray capacitance relatively insignificant.

The active buffer circuit 60a may be implemented integral to the flex circuit 50, or alternatively may be implemented as a separate integrated circuit and mounted to the flex circuit, for example as a surface mount component.

Figure 13:
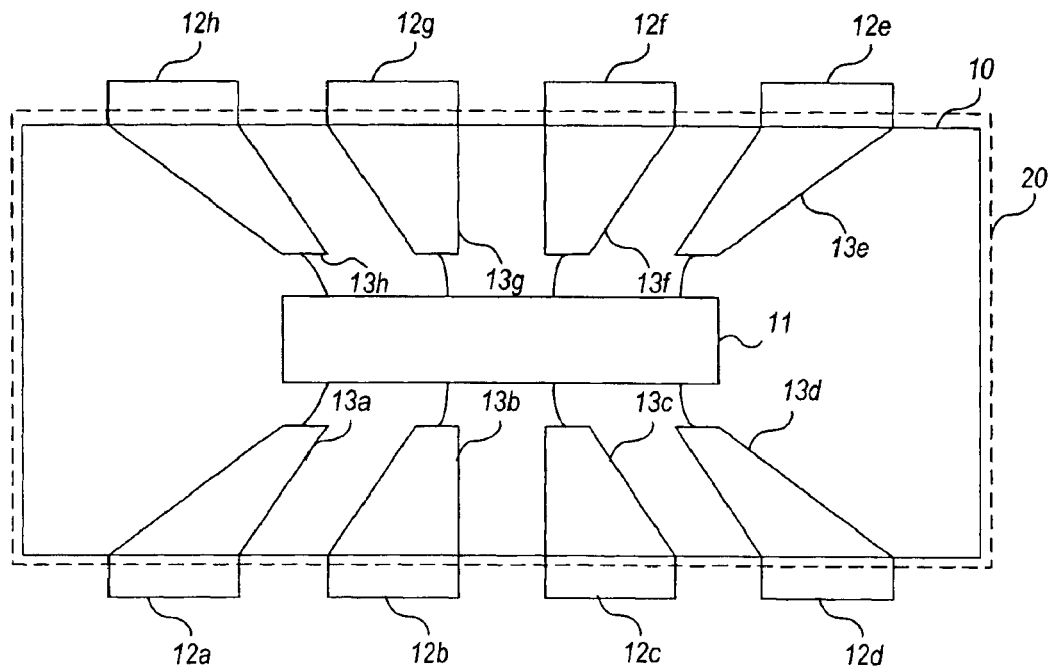
FIG. 13 is a top cut away view of the capacitive probe assembly of the invention aligned over an integrated circuit.
Figure 14:
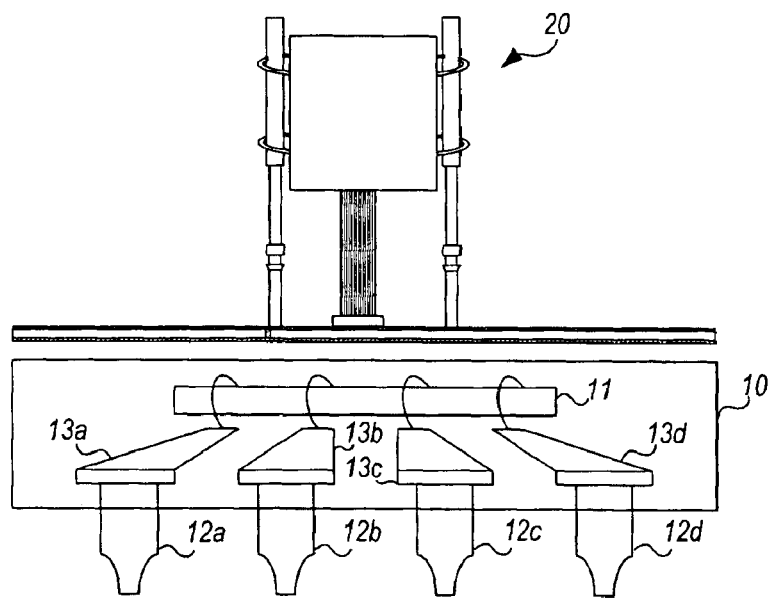
FIG. 14 is a side cut away view of the capacitive probe assembly of the invention aligned over the integrated circuit of FIG. 13.

FIG. 13 shows a top cut away view of the integrated circuit component 10 and the capacitive test probe 20 and FIG. 14 shows a side cut away view of the integrated circuit component 10 and the capacitive test probe 20. FIGS. 13 and 14 illustrate how the capacitive coupling occurs between the probe plate 23 o the capacitive probe assembly 20 and the leads 12a–12h of the integrated circuit 10. As shown therein, the integrated circuit package 10 contains an integrated circuit die 11 that is connected to input/output (I/O) leads 12a–12h by way of respective internal conductors 13a–13h. During test, a given respective internal conductor 13a–13h forms an electrically conductive plate, which acts as one plate of the capacitor formed with the capacitive plate 23 of the capacitive probe assembly 20. Although the capacitor created in this manner is small, it is sufficient to conduct a signal between the lead 12 under test and the capacitive plate 23 of the capacitive probe assembly 20, here illustrated by dashed lines, indicating that the capacitive probe assembly 20 is placed over the top of the integrated circuit package 10. In the illustrative embodiment, the capacitive plate 23 of the capacitive probe assembly 20 should be of substantially the same size and dimensions as the integrated circuit package 10. Of course, the capacitive plate 23 can also be approximately the size and dimensions of a single conductor 13; however, such an implementation may not be practical given the continuing reduction in size of integrated circuits and their leads/pins.

Referring back to FIG. 5, the diagram shows a very small test probe, which is placed only over the surface area of at least a single lead connector of an integrated circuit. In FIG. 5, where the integrated circuit 10 has a lead 12 with a very small test probe 20 placed over top of the lead connector 13, by moving the smaller test probe 20 around the top of the integrated circuit 10, each lead can be probed separately. One advantage of this embodiment is that the test probe is a one size fits all test probe and does not require customized sizing. However, this technique requires complicated robotics and only a single capacitive measurement can be taken at any given time.

Figure 15:
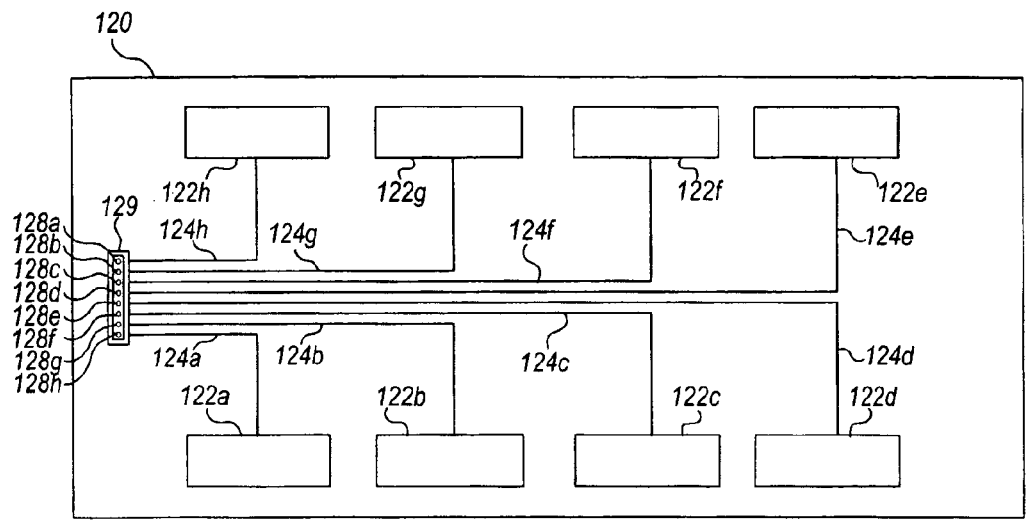
FIG. 15 is a top cut away view of a the probe plate assembly of a segmented capacitive probe assembly implemented in accordance with a second embodiment of the invention.
Figure 16:
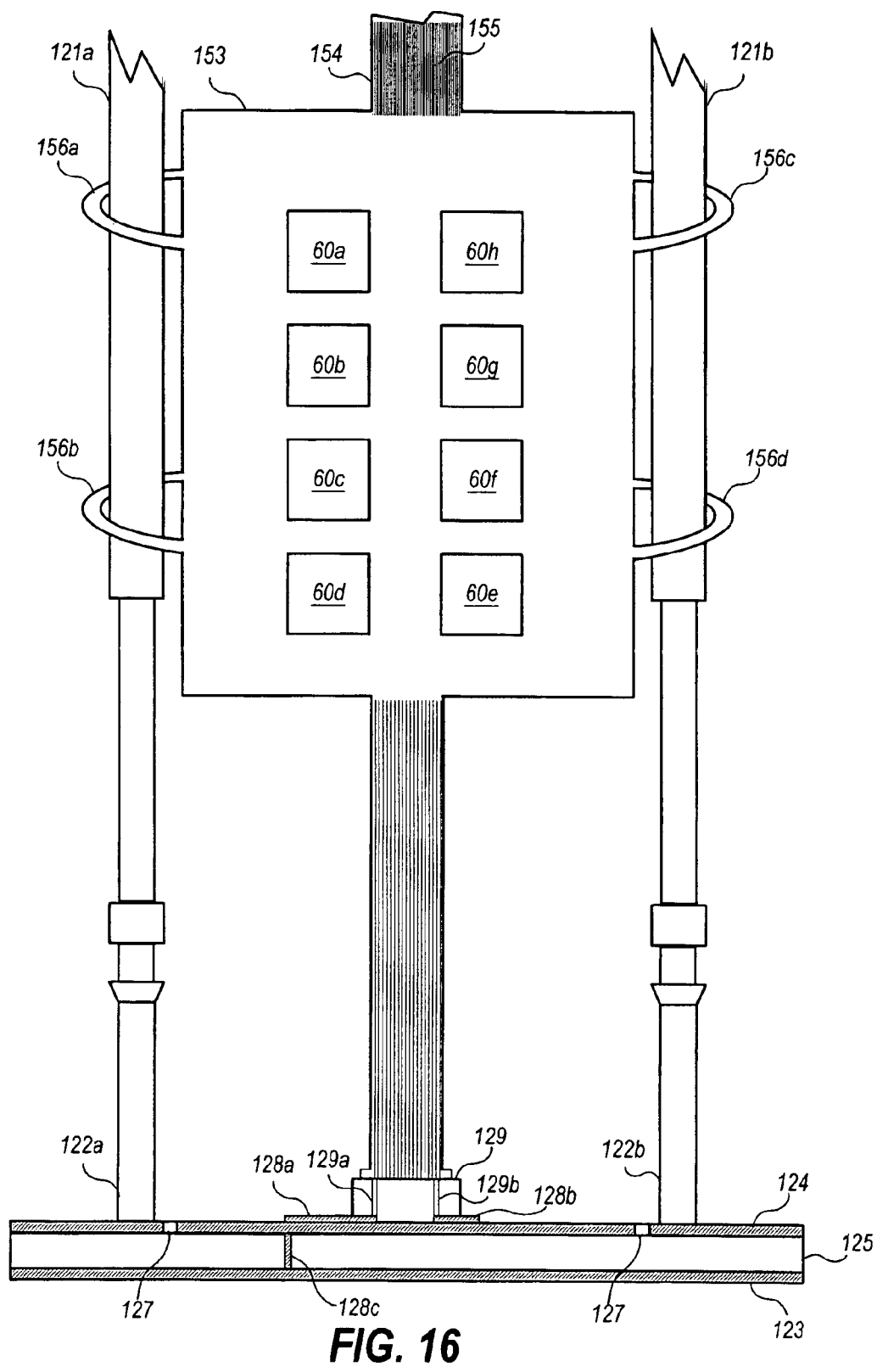
FIG. 16 is a top cut away view of a flex circuit implemented for use with the capacitive probe assembly of FIG. 15.

FIG. 15 illustrates a segmented capacitive probe assembly 120, and FIG. 16 illustrates a flex circuit 150 for use with the capacitive probe assembly 120 of FIG. 15, for allowing the collection of multiple capacitively coupled signals from multiple respective pins of the integrated circuit 10 using a single capacitive probe assembly. Referring now to FIG. 15, the segmented capacitive probe assembly 120 includes a number of small probe plate segments 122a–122h, each of which is designed be located over a single lead connector 13 of the integrated circuit package 10 when the test probe 120 is aligned over the integrated circuit package 10. Each of the probe plate segments 122a–122h is isolated from one another and preferably connected via a separate respective trace 124a–124h to a respective probe plate assembly connector signal socket 128a–128h of a probe plate assembly connector 129 that is attached to the probe plate assembly 120. Each probe plate assembly connector signal socket 128a–128h of the probe plate assembly connector 129 is designed to connect to a respective active amplifier circuit 160a–160h on the flex circuit 150, shown in FIG. 16, via a respective flex circuit probe 152a–152h that is designed to be seated in the respective probe plate assembly connector signal socket 128a–128h of the probe plate assembly connector 129. Each respective active buffer circuit 160a–160h on the flex circuit 150 outputs a separate amplifier signal onto a respective separate trace 155a–155h that is fed back to the host in parallel with each other amplifier signal.

Figure 17:
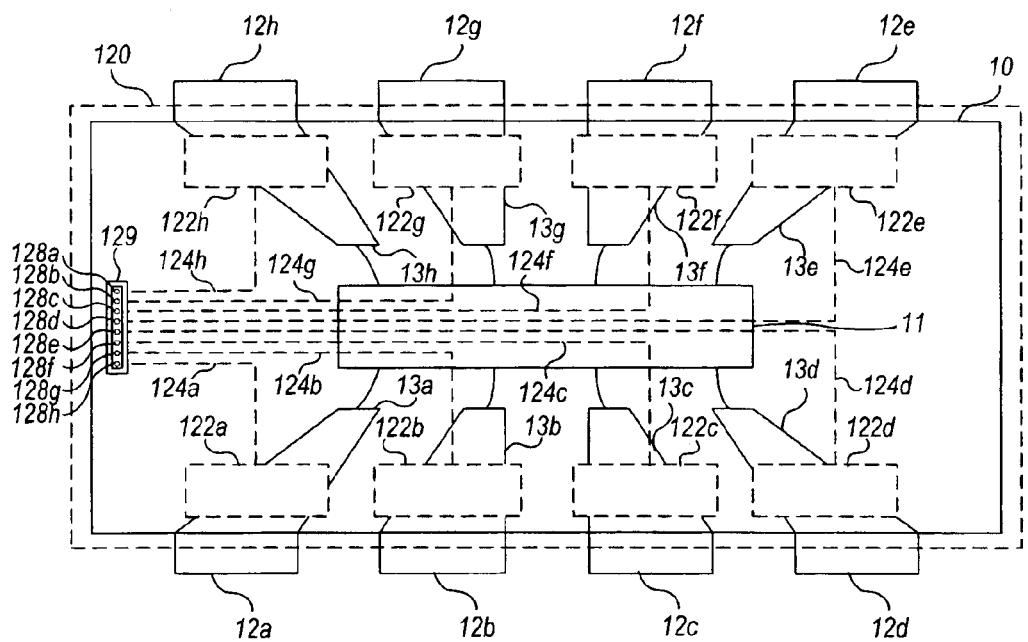
FIG. 17 is a top cut away view of the segmented capacitive test probe of FIG. 15 aligned over the integrated circuit.

FIG. 17 shows a top cut away view of the integrated circuit component 10 and the segmented capacitive test probe 120 aligned such that each probe plate segment 122a–122h is positioned over a respective internal conductor 13a–13h of the integrated circuit 10.

Figure 18:
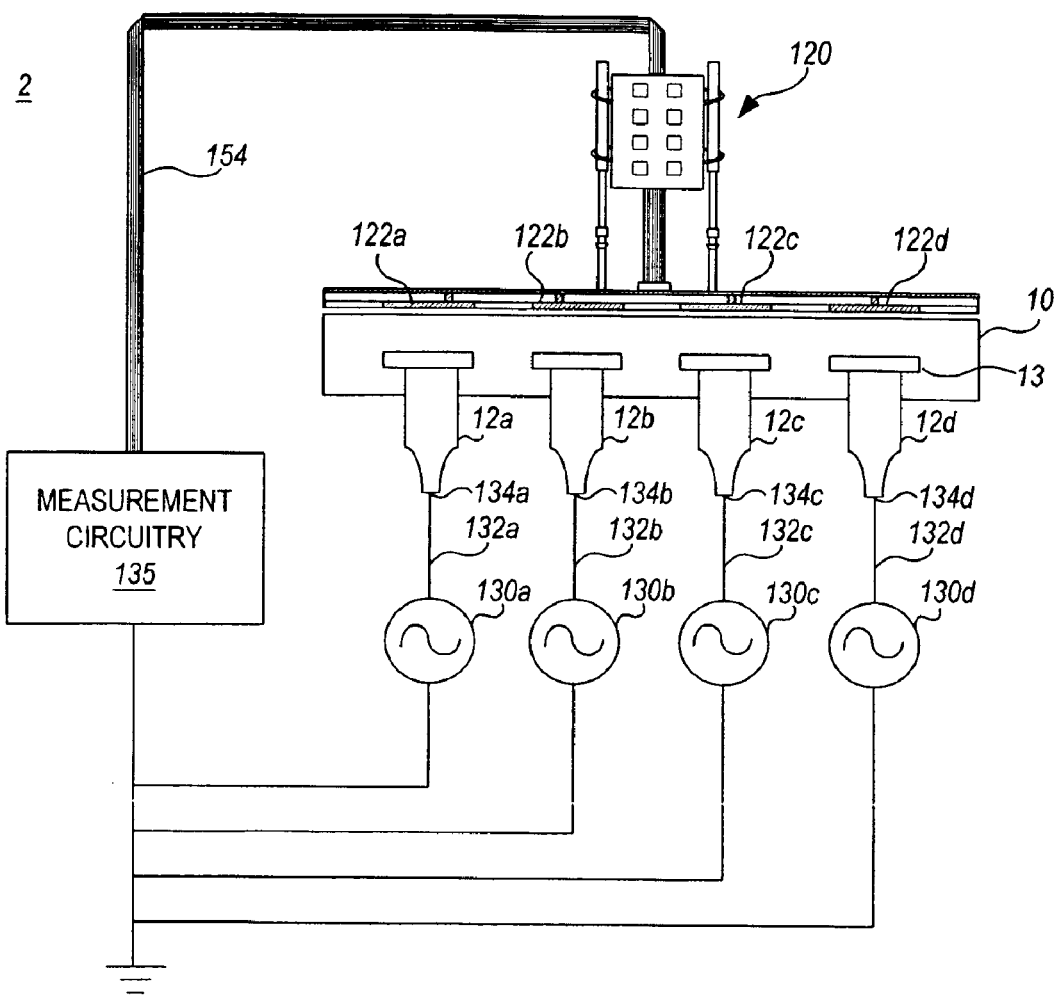
FIG. 18 is a schematic block diagram of an open-fault circuit test system which utilizes the segmented capacitive probe assembly of FIGS. 15–17.

FIG. 18 illustrates an open-fault circuit test system 2 which utilizes the segmented capacitive probe assembly 120 implemented in accordance with the invention. As shown, the open-fault circuit system 2 includes one or more a signal sources 130a–130d, which respectively supply a signal, typically eight kiloHertz (8 KHz) at two hundred millivolts (120 mV) to respective printed circuit board traces 132a–132d, which are respectively connected to respective integrated circuit leads under test 12a–12d at 134a–134d. The connection of the signal sources 130a–130d to the traces 132a–132d are typically made through a bed of nails connection pin.

The capacitive probe assembly 120 is aligned on top of the integrated circuit package 10 such that each of the probe plate segments 122a–122d are positioned over a respective integrated circuit conductor 13a–13d. A thin dielectric (not shown) may be placed between the component package 10 and the test probe 120. The flex-to-host probe connector of the flex circuit 150 is connected to a mating host-to-flex socket connector, which connect the signal traces passing between the host and flex circuit. The measurement circuitry 135 includes one or more measuring devices, such as an ammeter, a voltmeter or computing means to compute the effective capacitance. Depending on the implementation of the flex circuit and the availability of multiple signal sources, the capacitance measurements may be computed in parallel or serially. When a given measurement falls outside predetermined limits a determination is made that the lead associated with the measurement is diagnosed as being open.

When the test is performed, one or more of the signal sources 130a–130d are activated and applied to their respective assigned traces 132a–132d on the printed circuit board. If the trace 132a–132d is properly connected to its respective pin 12a–12d, the signal applied to the respective trace 132a–132d should then pass to the respective lead 12a–12d of the component 10. Through capacitive coupling, the respective signals are passed to the respective amplifier circuits 160a–160h on the flex circuit 150 and then to the measurement circuitry 135. If the measured parameter of a given pin 12a–12d falls within predetermined limits, then the respective lead 12a–12d is connected to the trace 132a–132d at location 134a–134d. If the lead 12a–12d is not connected at location 134a–134d or if the wire trace 132a–132d is broken, a smaller signed will be conducted to its respective capacitive plate 122a–122d on the capacitive probe assembly 120 and the threshold level of the signal will not be measured by the measurement circuitry 135, indicating that an open fault is present.

It will be appreciated that the segmented capacitive probe assembly 120 can be implemented to collect capacitively coupled signals in parallel, as shown in the embodiment of FIGS. 14–18. Alternatively, if multiple signal sources are unavailable, the capacitively coupled signals can be collected serially by applying the available signal source 130 to each pin 12a–12h and collecting the associated capacitive measurement one at a time.

Figure 19:
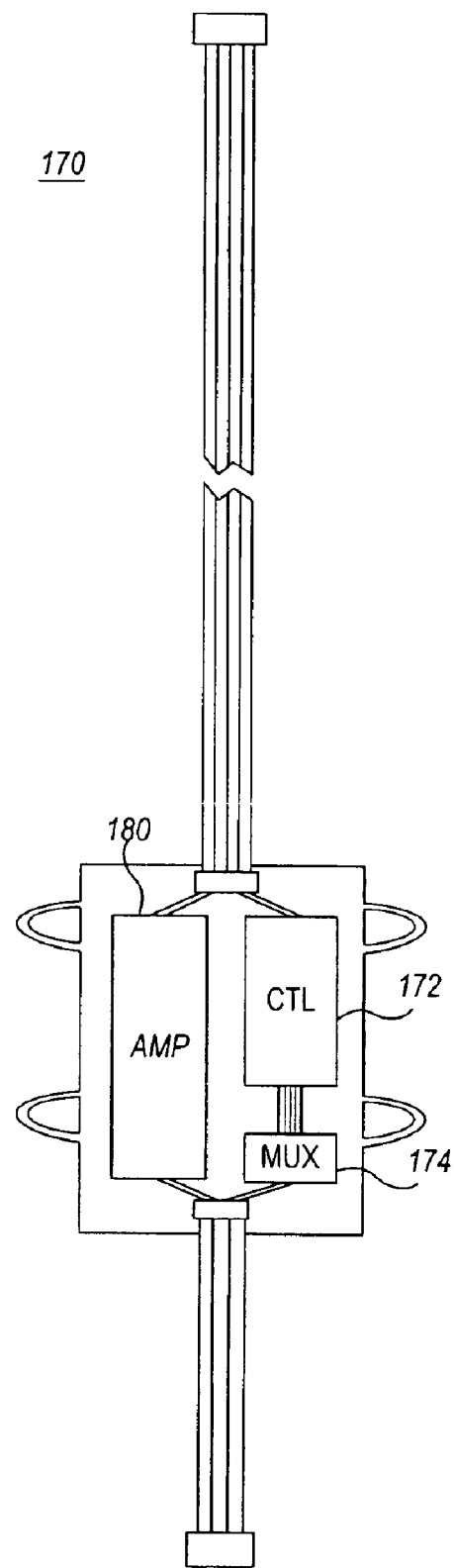
FIG. 19 is a top cut away view of a an alternative embodiment of a flex circuit that may be used with the segmented capacitive probe plate assembly.

In an alterative embodiment, the segmented capacitive probe assembly 120 may be implemented with a flex circuit 170 that includes fewer amplifier circuits than individual probe plates on the segmented capacitive probe assembly 120. In this embodiment, illustrated in FIG. 19, the flex circuit 170 includes control circuitry 172 and a multiplexer 174 that selectively connects a single probe plate from among the plurality of probe plates 122a–122h to the selected amplifier circuit (in this example, a single amplifier circuit 180) to collect a single capacitive measurement from a single selected pin 12a–12h.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A capacitive probe assembly, comprising:
   a flex circuit comprising:
      a sensor connection end having connections to a first sensor signal trace and a guard signal trace;
      an amplifier circuit which is coupled at an amplifier signal input to said first sensor signal trace, coupled at an output to a first measurement signal trace, coupled at an amplifier power input to a power signal trace, and coupled at an amplifier ground input to a ground signal trace; and
      a host connection end having connections to said power signal trace, said ground signal trace, and said first measurement signal trace;
   a capacitive probe having a flex circuit signal connection to said first sensor signal trace of said flex circuit; and
   a guard having a flex circuit guard connection to said guard signal trace of said flex circuit.

2. A capacitive probe assembly in accordance with claim 1, wherein:
   said capacitive probe comprises a number n, n greater than or equal to 1, of individual probes, each said individual probe connected to said guard signal trace of said flex circuit through said flex circuit guard connection and to a respective one of n sensor signal traces on said flex circuit through a respective one of n respective flex circuit signal connections.

3. A capacitive probe assembly in accordance with claim 2, further comprising:

a multiplexer which connects said amplifier input to only one of said n sensor signal traces on said flex circuit.

4. A capacitive probe assembly, comprising:

a flex circuit comprising:

a sensor connection end having connections to a number n, n greater than or equal to 1, of sensor signal traces and at least one guard signal trace;

a number m, m greater than or equal to 1, of amplifier circuits, each coupled at a respective amplifier signal input to one of said n sensor signal traces, coupled at a respective output to a respective measurement signal trace, coupled at a respective amplifier power input to a power signal trace, and coupled at a respective amplifier ground input to a ground signal trace; and a host connection end having connections to said power signal trace, said ground signal trace, and each of said respective measurement signal traces;

a capacitive probe having a number n, n greater than or equal to 1, of flex circuit signal connections to said respective n sensor signal traces of said flex circuit; and a guard having a flex circuit guard connection to said guard signal trace of said flex circuit.

5. A capacitive probe assembly in accordance with claim 4, wherein said capacitive probe comprises a number n, n greater than or equal to 1, of individual probes, each connected to said flex circuit guard connection to said guard signal trace of said flex circuit and to a respective one of said respective n flex circuit signal connections to a respective one of said n sensor signal traces of said flex circuit.

6. A flex circuit for a capacitive probe assembly, said capacitive probe assembly comprising a capacitive probe and a guard, said flex circuit comprising;

a sensor connection end comprising:

a connection to a first sensor signal trace, said first sensor signal trace connection connectable to said capacitive probe of said capacitive probe assembly; and a connection to a guard signal trace, said guard signal trace connection connectable to said guard of said capacitive probe assembly;

an amplifier circuit which is coupled at an amplifier signal input to said first sensor signal trace, coupled at an output to a first measurement signal trace, coupled at an amplifier power input to a power signal trace, and coupled at an amplifier ground input to a ground signal trace; and a host connection end having connections to said power signal trace, said ground signal trace, and said first measurement signal trace.

7. A flex circuit in accordance with claim 6, comprising:

n, n greater than or equal to 1, sensor signal traces on said flex circuit;

n flex circuit signal connections, each connected to a respective one of said n sensor signal traces;

wherein said capacitive probe comprises n individual probes, each said individual probe connectable to said guard signal trace of said flex circuit through said flex circuit guard connection and to a respective one of said n sensor signal traces on said flex circuit through a respective one of said n respective flex circuit signal connections.

8. A flex circuit in accordance with claim 7, further comprising:

a multiplexer which connects said amplifier input to only one of said n sensor signal traces.

9. A flex circuit for a capacitive probe assembly, said capacitive probe assembly comprising a capacitive probe and a guard, said flex circuit comprising:

a sensor connection end comprising:

a number n, n greater than or equal to 1, of sensor signal trace connections to a respective number n of sensor signal traces, said n sensor signal trace connections connectable to said capacitive probe of said capacitive probe assembly; and a connection to a guard signal trace, said guard signal trace connection connectable to said guard of said capacitive probe assembly;

a number m, m greater than or equal to 1, of amplifier circuits, each coupled at a respective amplifier signal input to one of said n sensor signal traces, coupled at a respective output to a respective measurement signal trace, coupled at a respective amplifier power input to a power signal trace, and coupled at a respective amplifier ground input to a ground signal trace; and a host connection end having connections to said power signal trace, said ground signal trace, and each of said respective measurement signal traces.

10. A flex circuit in accordance with claim 9, wherein:

said capacitive probe comprises a number n, n greater than or equal to 1, of individual probes, each connectable at said flex circuit guard connection to said guard signal trace of said flex circuit and at said respective n flex circuit signal connections to said respective n sensor signal traces of said flex circuit.

* * * * *